(12) United States Patent
Weber

(10) Patent No.: US 9,237,661 B2
(45) Date of Patent: Jan. 12, 2016

(54) MULTI-LAYERED CERAMIC ENCLOSURE

(71) Applicant: APPLE INC., Cupertino, CA (US)

(72) Inventor: Douglas J. Weber, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/691,368

(22) Filed: Apr. 20, 2015

(65) Prior Publication Data

US 2015/0230350 A1 Aug. 13, 2015

Related U.S. Application Data

(63) Continuation of application No. 13/246,625, filed on Sep. 27, 2011, now Pat. No. 9,011,997.

(51) Int. Cl.
| | |
|---|---|
| *H05K 5/00* | (2006.01) |
| *B32B 37/14* | (2006.01) |
| *B32B 18/00* | (2006.01) |
| *G06F 1/16* | (2006.01) |

(52) U.S. Cl.
CPC ............. *H05K 5/0086* (2013.01); *B32B 18/00* (2013.01); *B32B 37/144* (2013.01); *G06F 1/1656* (2013.01); *B32B 2315/02* (2013.01); *C04B 2235/9607* (2013.01); *C04B 2237/343* (2013.01); *C04B 2237/348* (2013.01); *C04B 2237/582* (2013.01); *C04B 2237/62* (2013.01); *C04B 2237/76* (2013.01); *Y10T 428/13* (2015.01)

(58) Field of Classification Search
CPC .. B32B 37/144; B32B 2315/02; B32B 18/00; G06F 1/1656; C04B 2235/9607; C04B 2237/343; C04B 2237/348; C04B 2237/582; C04B 2237/62; C04B 2237/76; Y10T 428/13; Y10T 428/12; H05K 5/0086
See application file for complete search history.

(56) References Cited

U.S. PATENT DOCUMENTS

| | | |
|---|---|---|
| 2010/0146766 A1 | 6/2010 | Dabov et al. |
| 2011/0159277 A1 | 6/2011 | Chiang et al. |
| 2012/0225286 A1 | 9/2012 | Du et al. |

OTHER PUBLICATIONS

Anglada, M. (2007). Fracture of Ceramics with Near Surface Gradient Residual Stresses. Key Engineering Materials, vol. 333, 97-106. (http://www.scientific.net/KEM.333.97).

(Continued)

*Primary Examiner* — Michael C Miggins
(74) *Attorney, Agent, or Firm* — Brownstein Hyatt Farber Schreck, LLP

(57) ABSTRACT

Techniques for fabricating a laminated ceramic housing that can be used for a handheld computing device that includes an enclosure having structural walls formed from a multi-layered ceramic material that can be radio-transparent. The multi-layered ceramic housing can be formed of a plurality of ceramic materials such as zirconia and alumina in any combination. The multi-layer ceramic substrate includes an inner layer and surface layers that sandwich the inner layer. The multi-layer ceramic substrate has an increased transverse strength due to the surface layers having a coefficient of thermal expansion (CTE) that is less than that of the inner layer.

25 Claims, 4 Drawing Sheets

(56) References Cited

OTHER PUBLICATIONS

Accuratus Corporation, Phillipsburg, NJ 08865 (http://web.archive.org/web/20100917033449/http://accuratus.com/zirc.html & http://web.archive.org/web/20100917033406/http://accuratus.com/alumox.h-tml).

Blattner, Aaron J, Lakshminarayanan, R, Shetty, Dinesh K (2001). Toughening of layered ceramic composites with residual surface compression: effects of layer thickness, Engineering Fracture Mechanics, vol. 68, Issue 1-7. ISSN 0013-7944, PII: 10.1016/S0013-7944(00)00096-5.

MULTI-LAYERED CERAMIC ENCLOSURE

CROSS-REFERENCE TO RELATED APPLICATION

This application is a continuation of U.S. patent application Ser. No. 13/246,625, filed Sep. 27, 2011, titled "Multi-Layered Ceramic Enclosure," now U.S. Pat. No. 9,011,997, issued Apr. 21, 2015, the entire disclosure of which is incorporated herein by reference in its entirety.

BACKGROUND OF THE INVENTION

1. Field of the Invention

The described embodiments relate generally to portable computing devices. More particularly, the present embodiments relate to enclosures of portable computing devices.

2. Description of the Related Art

In recent years, portable electronic devices, such as laptop computers, tablet computers, PDAs, media players, and cellular phones, have become compact and lightweight yet powerful. As manufacturers have been able to fabricate various operational components of these devices in smaller sizes, the devices themselves have become smaller. In most cases, despite having a more compact size, such components have increased power as well as operating speed. Thus, smaller devices may have much more functionality and power than larger devices of the past.

One design challenge is to provide an aesthetically pleasing enclosure that is functional for the intended purpose of the device. With more devices being capable of wireless communications, a radio transparent enclosure would be beneficial, as it would allow components, such as antennas, to be positioned inside the enclosure. Users also desire an enclosure that can withstand mishaps. Thus, a water-resistant and scratch-resistant enclosure would also be desirable.

Therefore, it would be beneficial to provide improved enclosures for portable computing devices, particularly enclosures that are functional and aesthetically pleasing yet durable.

SUMMARY OF THE DESCRIBED EMBODIMENTS

This paper describes various embodiments that relate to systems, methods, and apparatus for providing an enclosure suitable for a portable computing device. In particular, the enclosure is formed of a ceramic laminate. The ceramic laminate is formed of a plurality of layers of ceramic material where at least two adjoining layers have differing properties. In one embodiment, the adjoining layers can have different coefficients of thermal expansion (CTE) such that an outer layer has compressive residual stress and an inner portion sandwiched between at least two other layers with compressive stress profiles has a tensile residual stress profile.

According to one embodiment, a multi-layer ceramic housing arranged for enclosing operational components of a portable electronic device is described. The multi-layered ceramic housing includes at least a ceramic laminate structure. The ceramic laminate structure includes an inner layer and a first and second outer layer each in contact with a least a portion of the inner layer, the inner layer being arranged between the first and second outer layer in a stacked arrangement. The first and second outer layers have a CTE that is less than the inner layer, and wherein the first and second layers have a compressive residual stress profile and the inner layer has a tensile residual stress profile.

According to another embodiment, a method for forming a multi-layer ceramic substrate is described. The method is performed by carrying out the following operations: providing a first layer of ceramic material having a first binder loading, providing a second layer of ceramic material having a second binder loading, and processing the first and second layers of ceramic material to form the multi-layer ceramic substrate, wherein the first layer forms a top portion and bottom portion of the multi-layer ceramic and the second layer forms an interior portion of the multi-layer ceramic substrate sandwiched between the top and bottom portions. The top and bottom portions each have a compressive residual stress profile and wherein the inner portion has a tensile residual stress profile.

According to yet another embodiment, an apparatus for forming a multi-layer ceramic substrate is described. In one embodiment, the apparatus includes at least means for providing a first layer of ceramic material having a first binder loading, means for providing a second layer of ceramic material having a second binder loading, means for processing the first and second layers of ceramic material to form the multi-layer ceramic substrate, wherein the first layer forms a top portion and bottom portion of the multi-layer ceramic and the second layer forms an interior portion of the multi-layer ceramic substrate sandwiched between the top and bottom portions. The top and bottom portions each have a compressive residual stress profile and wherein the inner portion has a tensile residual stress profile.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF SELECTED EMBODIMENTS

Figure 1:
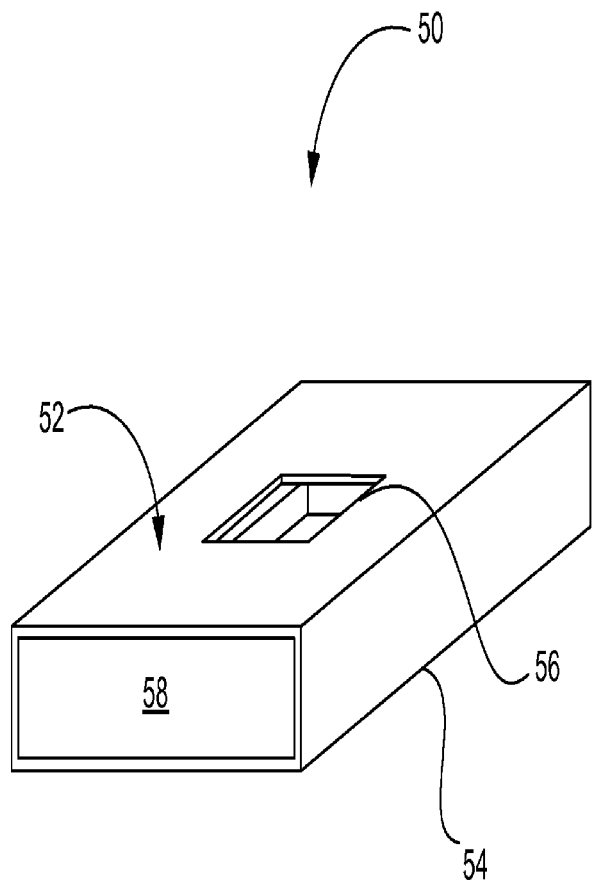
FIG. 1 is an exploded perspective diagram of an electronic device, in accordance with one embodiment.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims.

Lamination of different thin ceramic layers to form thick substrates can be considered a suitable solution to increase fracture toughness of ceramic materials. For the preparation of these composites warm pressing and sintering of ceramic layers can be used. Laminates with strong adhesion generate structure with residual stresses due to the mismatch in elastic modulus, shrinkage and coefficient of thermal expansion (CTE) among different layers. Such a residual stress gives rise to higher values of strength, apparent toughness and wear resistance over monolithic materials with the same composition In particular the observed toughening mechanism can be related to residual stresses and crack propagation. The stress profile of the laminated structure has a strong effect on the apparent fracture toughness of a laminate composite.

The embodiments described herein relate to using ceramic laminates in the fabrication of a housing used to enclose and support operational components used for a portable electronic device. The housing is formed of multiple layers of ceramic materials arranged in such a way to form compressive outer layers and tensile inner layer as evidenced by a stress profile. In one embodiment, the multiple layers can be formed of ceramic materials along the lines of aluminum oxide ($Al_2O_3$), also referred to as alumina, and known to be RF energy transparent and a good electrical insulator. Other ceramic materials considered include zirconium dioxide (Zr, Ti,Ca)$O_2$, also referred to as zirconia, known to have superior mechanical properties, but is nonetheless, essentially opaque to RF energy transmission. Therefore, in those situations where the portable electronic device includes RF circuitry, it is advantageous to provide multiple layers of ceramic material that when taken together provides a housing that is both mechanically resilient and suitably RF energy transparent.

Accordingly, the embodiments described relate to a multi-layered ceramic structure used to enclose and support various operational components for a portable handheld electronic device having RF capabilities such as WiFi and cellular telephony. The multi-layered ceramic structure includes a first and second outer layer formed of a ceramic material suitably configured for providing good resistance to externally applied stress and other environmental affronts. In one embodiment, the outer layers can be formed of, for example, Zirconia, using any available ceramic fabrication process such as a doctor blade process in which a sharp blade is used in combination with a ceramic slurry to apply a thin layer of ceramic material on a roller assembly to form thin sheets of ceramic material. Other techniques well known in the art of ceramic fabrication includes at least ceramic injection molding (CIM); low temperature co-fired ceramic (LTCC), tape casting and so on.

In any case, the thin sheets of ceramic material can be infused with varying amounts and size of binding material (generally organic material such as wax, plastic, etc.) in order to adjust an amount of shrinkage of the thin ceramic sheets during a firing process in which the binding material is burned off. For example, by infusing the thin ceramic sheets with a higher binder loading, the more extensive the shrinkage of the layer and the more compressive stress profile will be generated in the layer. Alternatively, by providing a lower binder loading, the amount of shrinkage is commensurably reduced providing a more tensile stress profile. In this way, by modifying the relative shrinkage in each layer, a specific stress profile can be created. The specific stress profile can, for example, be associated with a compressive stress on exposed surfaces and be associated with tensile stress within interior regions coupled to the compressive surface regions.

These and other embodiments are discussed below with reference to FIG. 1-xx. However, those skilled in the art will readily appreciate that the detailed description given herein with respect to these figures is for explanatory purposes only and should not be construed as limiting.

FIG. 1 is an exploded perspective diagram of an electronic device 50, in accordance with one embodiment. The device 50 may be sized for one-handed operation and placement into small areas, such as a pocket. In other words, the device 50 can be a handheld pocket-sized electronic device. By way of example, the electronic device 50 may correspond to a computer, media device, telecommunication device, and the like. The device 50 includes a housing 52 that encloses and supports internally various electrical components (including, for example, integrated circuit chips and other circuitry) to provide computing operations for the device 50. The housing 52 can also define the shape or form of the device 50. That is, the contour of the housing 52 may embody the outward physical appearance of the device 50. It should be noted that, although the device 50 is illustrated in FIG. 1 with 90 degree edges, it will be understood that the device 50 can have rounded or chamfered edges.

The housing 52 generally includes a main integral body 54. By integral, it is meant that the main body is a single complete unit. By being integrally formed, the main body is structurally stiffer than conventional housings, which typically include two parts that are fastened together. Furthermore, unlike conventional housings that have a seam between the two parts, the main body has a substantially seamless appearance. Moreover, the seamless housing prevents contamination and is more water resistant than conventional housings. The main body 54 can also include one or more windows 56, which provide access to the electrical components, particularly the user interface elements, when they are assembled inside the cavity 58 of the main body 54. In the described embodiment, the main body 54 may be formed from a variety of ceramic materials. In a particular embodiment, the main body is formed of a plurality of ceramic materials combined in a layer like arrangement. In one embodiment, the layers of ceramic material can be different. For example, an inner layer can be formed of a first ceramic material sandwiched between at least two outer layers. In one implementation, the ceramic materials can be the same but have different properties.

The ceramic material selected generally depends on many factors including, but not limited to, strength (tensile), density (lightweight), strength to weight ratio, Young's modulus, corrosion resistance, formability, finishing, recyclability, tooling costs, design flexibility, manufacturing costs, manufacturing throughput, reproducibility, and the like. The material selected may also depend on electrical conductivity, thermal conductivity, radio wave transparency, combustibility, toxicity, and the like. The material selected may also depend on aesthetics, including color, surface finish, and weight.

For example, if it is desired that the housing 52 be RF transparent, then the main body 54 can be formed of layers of ceramic material (such as alumina) having the desired RF transparency. However, in order to assure that the housing 52 is resistant to external forces, the outer layers of the housing 52 can be formed of alumina having been formed using a high binder loading providing a more compressive residual stress than those internal layers sandwiched between the outer layers where the inner layers have a lower binder loading providing a more tensile residual stress. In this way, the outer layers provide a more resistant and resilient surface for the housing 52.

However, in order to optimize the properties of housing 52, it may be advantageous to provide layers of different ceramic materials. For example, although alumina has good RF transmission properties, the strength of, for example, zirconia can be better suited for applications such as portable media players where housing 52 would be exposed to substantial mechanical, chemical, and other environmental impacts. In this case, the outer layers of the housing 52 can be formed of, for example, zirconia, having a residual compressive stress profile that sandwiches an internal layer of alumina providing a good RF transmission capability. For many of the reasons above, the housing 52 can be formed of multi-layered (i.e., laminated) ceramic materials that are strong, stiff, and radio transparent and therefore a suitable material for an enclosure of an electronic device capable of wireless communications. The radio transparency is especially important for wireless hand held devices that include antennas internal to the enclosure. Radio transparency allows the wireless signals to pass through the enclosure and, in some cases, even enhances these transmissions.

As discussed in more detail below, the laminated ceramic material can be formed so that the enclosure can have a seamless or substantially seamless appearance. The seamless enclosure, in addition to being aesthetically pleasing, can provide the added benefit of less contamination and moisture intrusion into the interior of the device. In some embodiments, the main body 54 can have a wall having a continuous uniform thickness all around. In other embodiments, however, the wall of the main body 54 can be thicker at the edge or corner portions to provide strength in the areas where strength is more needed.

Figure 2:
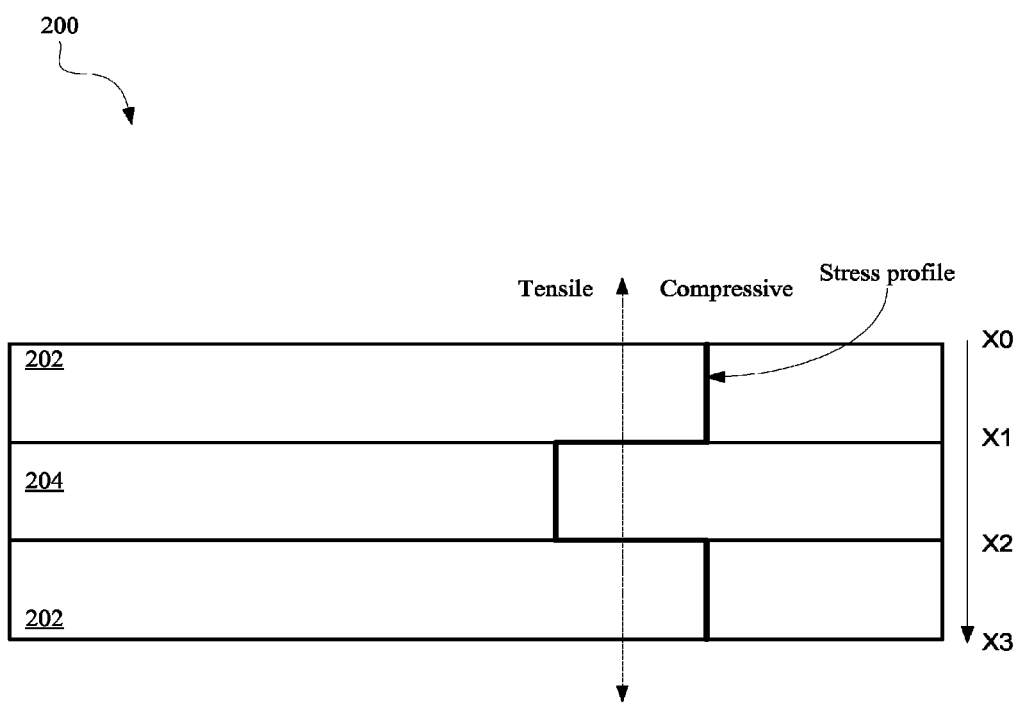
FIG. 2 shows a representation cross section of housing as one embodiment of housing shown in FIG. 1 in accordance with the described embodiments.
Figure 3A:
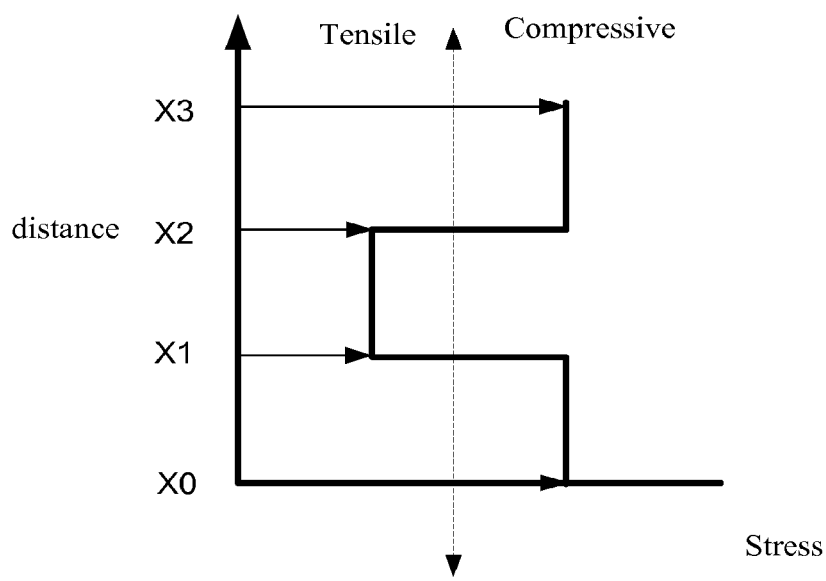
FIGS. 3A and 3B show representative residual stress profiles for a ceramic laminate (stepped profile in FIG. 3A) and conventional glass (parabolic profile in FIG. 3B).
Figure 3B:
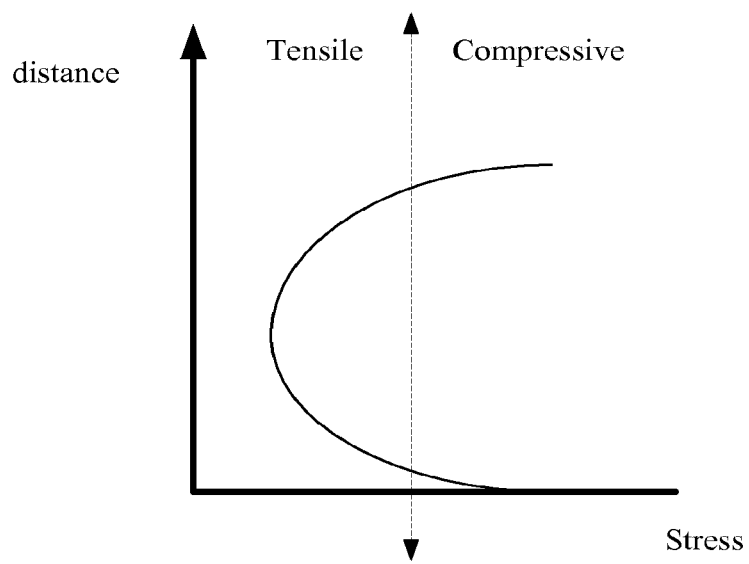

FIG. 2 shows a representation cross section of housing 200 as one embodiment of housing 52 shown in FIG. 1 in accordance with the described embodiments. The cross sectional view of housing 200 provides one example of a laminated ceramic structure that can be used to provide housing 200 with the properties appropriate for the electronic device for which it is intended. For example, layer 202 can be formed of a ceramic material (such as zirconia). In order to provide layer 202 with a relatively compressive stress profile, layers 202 can be fabricated in using a high binder loading as compared to layer 204 sandwiched there between having been fabricated with a lower binder loading. In this way, a composite residual stress profile as shown in FIG. 3A can be provided showing a stepped residual stress profile. By stepped residual stress profile, it can be seen that the residual stress in both layers 202 are compressive whereas the residual stress is tensile in layer 204. The stepped nature of the laminate structure differs markedly from the more Gaussian shape associated with, for example, hardened glass shown for comparison on FIG. 3B.

Another benefit of using a multi-layer ceramic is that the enclosure can be made stronger if the housing includes multiple layers having different coefficients of thermal expansion (CTE). If the external layer has a high CTE and the internal layer has a low CTE, then the two layers 202, 204 will fuse into one layer, with the external surface layer 202 being in a compressive state. The skilled artisan will appreciate that ceramic material is stronger in compression and weaker in tension, and the different binder loadings will result in the external surface layer 202 being in compression and therefore stronger.

Figure 4:
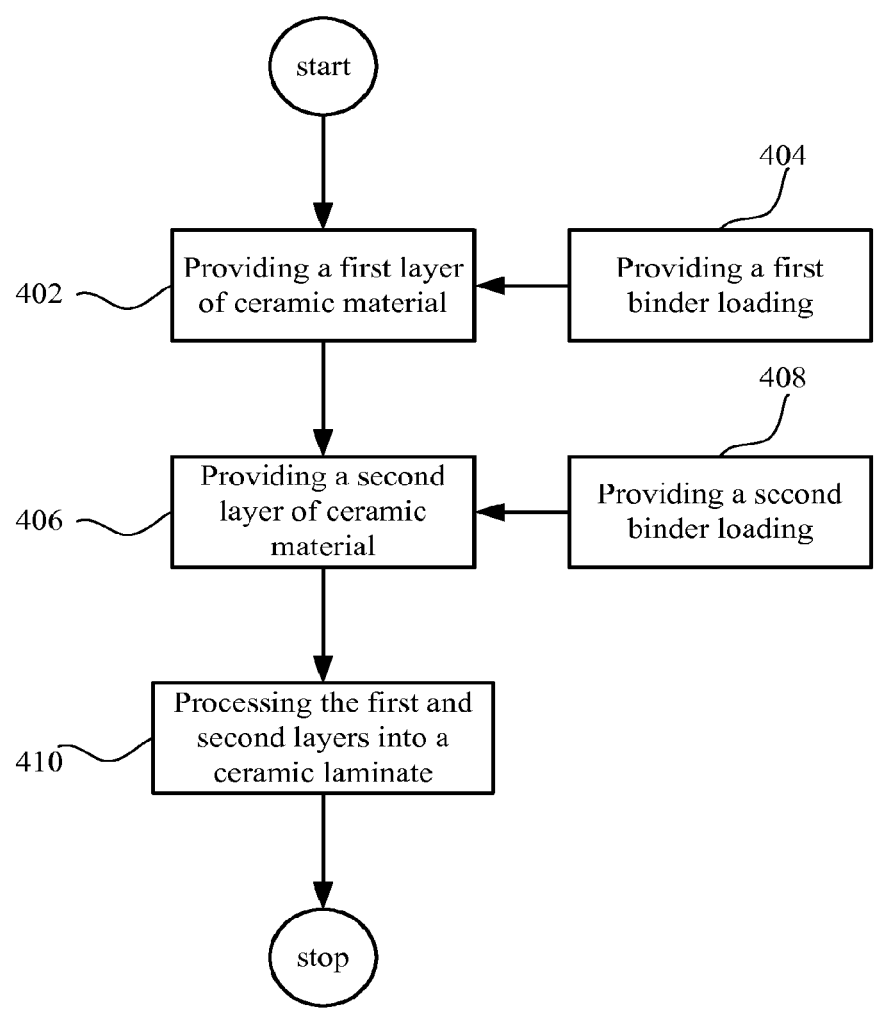
FIG. 4 shows a flowchart detailing process in accordance with the described embodiments

FIG. 4 shows a flowchart detailing process 400 in accordance with the described embodiments. Process 400 can be used to form a ceramic laminate structure. The ceramic laminate structure can be used to enclose operational components used in the assembly of a portable electronic device. The ceramic laminate structure can take the form of housing. In those cases where the portable electronic device utilizes RF circuits, the ceramic laminate structure can be formed of a combination of ceramic materials some of which provide good mechanical properties and resistance to environmental affront and other ceramic materials that provide good RF transmissivity. In this way, an optimal arrangement of ceramic layers can be provided that are customized for a particular functionality of the portable electronic device.

Process 400 can be performed by providing a first layer of ceramic material at 402. In one embodiment, the first layer of ceramic material can be arranged to have a tensile residual stress profile. This can be accomplished by controlling an amount of shrinkage during a firing process. The amount of shrinkage can be controlled by adjusting a binder loading in the ceramic material. A higher binder loading can cause the ceramic material to undergo relatively more shrinkage. Alternatively, a lower binder loading can result in less shrinkage and therefore a more tensile residual stress. At 404, the first layer is associated with a first binder loading. For example, if the first layer is determined to be associated with an exterior surface, than the first binder loading is associated with a high binder loading. Next at 406, a second layer of ceramic material is provided. The second layer of ceramic material is then associated with a second binder loading at 408. As with the first layer, the second binder load is dependent upon the function to be performed by the second layer. For example, if the second layer is determined to form the body of a housing that must be RF transparent, then the ceramic material of the second layer can be different than the ceramic material that forms the first layer. Moreover, the difference in binding loadings between the first and second layers can be associated with a residual stress profile that limits damage caused by external impacts, and so forth. At 410, the first and second ceramic layers are processed to form a ceramic laminate in accordance with the first and second binder loading. In one embodiment, the ceramic laminate by stacking the first and second layers and then firing the stacked layers.

Moreover, although not shown, the various components of the enclosure may consist of multiple layers that are glued, press fit, molded or otherwise secured together. In one example, the enclosure consists of multiple layers that form a single laminate structure formed for example by gluing. By way of example, the entire or portions of the enclosure walls may be formed from layers of metals, ceramics and/or plastics. In the case of radio transparency, the layers may include glass and ceramics as, for example, forming a wall with a glass outer layer and a ceramic inner layer (or vice versa).

While this invention has been described in terms of several preferred embodiments, there are alterations, permutations, and equivalents, which fall within the scope of this invention. For example, although some embodiments include an integrally formed internal rail system, in some cases the internal rail system may be a separate component that is attached within the main body or it may not even be included in some cases. It should also be noted that there are many alternative ways of implementing the methods and apparatuses of the present invention. For example, although an extrusion process is preferred method of manufacturing the integral tube, it should be noted that this is not a limitation and that other manufacturing methods may be used in some cases (e.g., injection molding, press forming). In addition, although the invention is directed primarily at portable electronic devices such as media players, and mobile phones, it should be appreciated that the technologies disclosed herein can also be applied to other electronic devices, such as remote controls, mice, keyboards, monitors, and accessories for such devices. It is therefore intended that the following appended claims be interpreted as including all such alterations, permutations, and equivalents as fall within the true spirit and scope of the present invention.

What is claimed is:

1. A ceramic laminate enclosure for an electronic device, comprising:
   an integral body defining a cavity to receive components of the electronic device, the integral body comprising:

an external surface layer in compressive stress and having a first coefficient of thermal of expansion;

an internal surface layer defining at least a portion of the cavity, the internal surface layer in compressive stress and having the first coefficient of thermal of expansion; and an intermediate layer between the external surface layer and the internal surface layer, the intermediate layer in tension and having a second coefficient of thermal of expansion that is greater than the first coefficient of thermal expansion, wherein a transition region between the external surface layer and the internal surface layer has a stepped residual stress profile.

2. The ceramic laminate enclosure of claim 1, wherein the external surface layer comprises a chamfered edge.

3. The ceramic laminate enclosure of claim 1, wherein the external surface layer comprises a rounded edge.

4. The ceramic laminate enclosure of claim 1, wherein the external surface layer and the intermediate layer are substantially radio transparent.

5. The ceramic laminate enclosure of claim 1, the integral body comprises an antenna.

6. The ceramic laminate enclosure of claim 1, the integral body comprising a plastic area forming at least a portion of a sidewall of the ceramic laminate enclosure.

7. The ceramic laminate enclosure of claim 1, the integral body comprising a metal layer disposed on the external surface layer.

8. The ceramic laminate enclosure of claim 1, wherein the electronic device comprises an accessory device.

9. The ceramic laminate enclosure of claim 1, wherein the external surface layer comprises a cosmetic surface finish.

10. The ceramic laminate enclosure of claim 1, wherein the external surface layer and the internal surface layer of the integral body are formed of a first ceramic material.

11. The ceramic laminate enclosure of claim 10, wherein the intermediate layer of the integral body is formed of a second ceramic material that is different from the first ceramic material.

12. The ceramic laminate enclosure of claim 11, wherein the first ceramic material is zirconium dioxide and the second ceramic material is aluminum oxide.

13. The ceramic laminate enclosure of claim 1, wherein the integral body is formed in a rectangular shape.

14. The ceramic laminate enclosure of claim 13, wherein the integral body comprises:
a top surface defining an aperture;
four sidewalls; and
a bottom surface.

15. The ceramic laminate enclosure of claim 14, wherein the four sidewalls have rounded edges.

16. A method for forming a ceramic laminate enclosure for an electronic device, the method comprising:
forming an integral body by performing the operations of:
forming an external surface layer in compressive stress and having a first coefficient of thermal of expansion by providing a first layer of ceramic material with a first binder loading;
forming an internal surface layer defining at least a portion of a cavity and having the first coefficient of thermal of expansion by providing a second layer of ceramic material with the first binder loading; and
forming an intermediate layer between the external surface layer and the internal surface layer, the intermediate layer in tension and having a second coefficient of thermal of expansion that is greater than the first coefficient of thermal expansion by providing an internal layer of ceramic material with a second binder loading.

17. The method of claim 16, further comprising:
forming the external surface layer and the internal surface layer of the integral body from a first ceramic material; and
forming the intermediate layer of the integral body from a second ceramic material that is different from the first ceramic material.

18. The method of claim 16, further comprising forming at least a portion of an antenna with the integral body.

19. The method of claim 16, further comprising forming an aperture in the integral body, the aperture configured to receive a user interface element.

20. The method of claim 16, further comprising forming the integral body into a rectangular shape.

21. A ceramic laminate enclosure for an accessory device, comprising:
an integral body defining a cavity to receive electronic components of the accessory device, the integral body comprising:
an external surface layer in compressive stress and having a first coefficient of thermal of expansion, the external surface comprising:
a top surface defining an aperture sized to receive a user interface element;
a bottom surface; and
four sidewalls connecting the top surface to the bottom surface;
an internal surface layer defining at least a portion of the cavity configured to receive at least a portion of the user interface element, the internal surface layer in compressive stress and having the first coefficient of thermal of expansion; and
an intermediate layer between the external surface layer and the internal surface layer, the intermediate layer in tension and having a second coefficient of thermal of expansion that is greater than the first coefficient of thermal expansion,
wherein a transition region between the external surface layer and the internal surface layer has a sharp transition from the tension of the intermediate layer to the compressive stress of the external surface layer.

22. The ceramic laminate enclosure of claim 21, the integral body comprising a metal layer disposed on the external surface layer.

23. The ceramic laminate enclosure of claim 21, wherein the external surface layer and the intermediate layer are substantially radio transparent.

24. The ceramic laminate enclosure of claim 21, wherein the four sidewalls have rounded edges.

25. The ceramic laminate enclosure of claim 21, wherein the external surface layer comprises a chamfered edge.

* * * * *